(12) United States Patent
Periyannan et al.

(10) Patent No.: US 10,908,210 B2
(45) Date of Patent: Feb. 2, 2021

(54) DIE CRACK DETECTION

(71) Applicant: SanDisk Technologies LLC, Plano, TX (US)

(72) Inventors: Kirubakaran Periyannan, San Jose, CA (US); Naresh Battula, Santa Clara, CA (US); Chang Siau, Saratoga, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 16/399,786

(22) Filed: Apr. 30, 2019

(65) Prior Publication Data
US 2020/0103462 A1    Apr. 2, 2020

Related U.S. Application Data

(60) Provisional application No. 62/738,711, filed on Sep. 28, 2018.

(51) Int. Cl.
| | |
|---|---|
| *H01L 23/52* | (2006.01) |
| *H01L 23/58* | (2006.01) |
| *G01R 31/28* | (2006.01) |
| *G11C 16/34* | (2006.01) |
| *H01L 23/528* | (2006.01) |
| *H01L 23/00* | (2006.01) |

(52) U.S. Cl.
CPC ..... *G01R 31/2884* (2013.01); *G01R 31/2896* (2013.01); *G11C 16/3459* (2013.01); *H01L 23/5283* (2013.01); *H01L 23/585* (2013.01); *H01L 24/01* (2013.01); *H01L 2924/1434* (2013.01); *H01L 2924/3512* (2013.01)

(58) Field of Classification Search
CPC ... H01L 23/5283; H01L 23/585; H01L 24/01; G01R 31/2884; G01R 31/2896; G11C 16/3459
See application file for complete search history.

(56) References Cited

U.S. PATENT DOCUMENTS

| | | | | |
|---|---|---|---|---|
| 6,449,748 B1 * | 9/2002 | Jeng | .................... | G01R 31/3173 257/48 |
| 6,649,986 B1 * | 11/2003 | Ishizaki | .................. | H01L 22/34 257/414 |
| 7,250,311 B2 * | 7/2007 | Aoki | ....................... | H01L 22/34 257/781 |

(Continued)

FOREIGN PATENT DOCUMENTS

KR    20100003043 A  *  1/2010

*Primary Examiner* — Ida M Soward
(74) *Attorney, Agent, or Firm* — Vierra Magen Marcus LLP

(57) ABSTRACT

Systems and methods for die crack detection are disclosed. In one exemplary embodiment, a die includes a first conductive segment, an intermediate conductive segment, and a second conductive segment. The crack detection ring substantially surrounds the die according to a serpentine path having a plurality of legs, wherein each leg intersects the first conductive segment at a first intersection, an intermediate conductive segment at an intermediate intersection and a second conductive segment at a second intersection, wherein the intermediate intersection is horizontally offset from at least the first intersection and the second intersection.

14 Claims, 12 Drawing Sheets

(56) References Cited

U.S. PATENT DOCUMENTS

| | | | | |
|---|---|---|---|---|
| 7,791,070 B2* | 9/2010 | Huang | ............... | H01L 23/585 257/48 |
| 8,890,560 B2* | 11/2014 | Kaltalioglu | ........... | H01L 23/585 324/762.01 |
| 9,698,066 B2* | 7/2017 | Lee | .................... | H01L 27/1157 |
| 9,741,667 B2* | 8/2017 | Zeng | .................... | H01L 23/585 |
| 9,768,129 B2* | 9/2017 | Lee | ....................... | H01L 22/34 |
| 10,490,514 B2* | 11/2019 | Baek | .................... | H01L 23/585 |
| 2006/0189007 A1* | 8/2006 | Aoki | ....................... | H01L 22/34 438/14 |
| 2010/0109005 A1* | 5/2010 | Grillberger | ............. | H01L 22/34 257/48 |
| 2011/0221460 A1* | 9/2011 | Trebo | ................. | G01R 31/2884 324/750.3 |
| 2013/0009663 A1* | 1/2013 | Gauch | .................... | H01L 22/34 324/62.01 |
| 2014/0236353 A1* | 8/2014 | Annaz | ................... | B25J 9/1674 700/253 |
| 2015/0170979 A1* | 6/2015 | Dennison | ........... | G01R 31/2896 257/48 |
| 2016/0197056 A1* | 7/2016 | Bhowmik | .............. | H01L 22/34 257/48 |
| 2017/0125360 A1* | 5/2017 | Lee | ....................... | H01L 23/573 |
| 2017/0323835 A1* | 11/2017 | Ogawa | ................. | H01L 23/562 |
| 2019/0164911 A1* | 5/2019 | Pan | ..................... | G01R 31/2831 |
| 2019/0235017 A1* | 8/2019 | Roh | .................... | G01R 31/2607 |
| 2019/0271739 A1* | 9/2019 | Werhane | ............. | G01R 31/307 |
| 2019/0324080 A1* | 10/2019 | Si | ....................... | G01R 31/2856 |

\* cited by examiner

DIE CRACK DETECTION

CROSS-REFERENCE TO RELATED APPLICATIONS

The present application claims the benefit of priority to U.S. Provisional Application No. 62/738,711, filed on Sep. 28, 2018, entitled "Border Die Crack Detection", which is incorporated herein by reference as though set forth in its entirety.

TECHNICAL FIELD

The present disclosure, in various embodiments, relates to manufacturing of non-volatile memory devices, and more particularly, to die crack detection.

BACKGROUND

In certain exemplary embodiments, many separate non-volatile memory devices are manufactured together on a same wafer and must be physically separated, or cut, after manufacturing. Sawing out distinct memory devices may, in some examples, cause a crack on an outer edge of the cut-out portion. In other example, a crack may be caused by packaging. This crack may extend into the memory device causing errors or other problems with the memory device.

In some examples, some devices include a conductive ring around the memory device that, when broken by a crack, determines that a crack is present based on electrical continuity around the memory device. However, such a ring may not detect all cracks based on the size, location, or direction of the crack.

SUMMARY

Systems, apparatuses and methods are presented for crack detection. In one exemplary embodiment, a die with an integrated circuit formed thereon, includes a first conductive segment that defines part of a crack detection ring, a second conductive segment that defines part of the crack detection ring; and an intermediate conductive segment, between the first conductive segment and the second conductive segment, that defines part of the crack detection ring, wherein the crack detection ring substantially surrounds the integrated circuit according to a serpentine path having a plurality of legs, each of which follows a pathway that intersects the first conductive segment at a first intersection, intersects the second conductive segment at a second intersection, and intersects the intermediate conductive segment at an intermediate intersection horizontally offset from at least one of the first intersection and the second intersection.

In another exemplary embodiment, at least one of the plurality of legs includes a horizontal segment extending along a portion of the intermediate conductive segment, wherein the first intersection is vertically aligned with a first end of the portion and the second intersection is vertically aligned with a second end of the portion.

In one exemplary embodiment, in each of the plurality of legs, the first conductive segment intersects, at the first intersection, with a first via extending at least partway from the first conductive segment to the intermediate conductive segment, and the second conductive segment intersects, at the second intersection, with a second via, horizontally offset from the first via, extending at least partway from the second conductive segment to the intermediate conductive segment.

In a further exemplary embodiment, the crack detection ring includes a first portion of the first conductive segment and a second portion of the first conductive segment, wherein the first portion and the second portion are offset from each other by a distance of 250 nm or less.

In one exemplary embodiment, the first leg of the plurality of legs includes a horizontal portion that includes a first horizontal segment and a second horizontal segment, wherein the first horizontal segment and the second horizontal segment intersect different layers of a die.

In another exemplary embodiment, for a first leg of the plurality of legs, the first intersection is horizontally offset in a first direction relative to the second intersection and, for a second leg of the plurality of legs that is adjacent to the first leg, the first intersection is horizontally offset in second direction, opposite to the first direction, from the second intersection.

In a further exemplary embodiment, for the first leg and the second leg, the intermediate intersection is horizontally centered between the first intersection and the second intersection.

In one exemplary embodiment, the first leg and the second leg are positioned to resemble opposing sides of a first trapezoid, and a third leg and fourth leg of the plurality of legs, adjacent to the first leg and the second leg, are positioned to resemble opposing sides of a second trapezoid that is vertically flipped in relation to the first trapezoid.

In another exemplary embodiment, an apparatus includes a memory device and a crack detection ring that substantially surrounds the memory device, the memory device formed at least partially on one or more of a first conductive segment, an intermediate conductive segment, and a second conductive segment, wherein the crack detection ring comprises a serpentine path having a first leg that follows a pathway intersecting the first conductive segment, the intermediate conductive segment, and the second conductive segment with at least two consecutive turns in alternating directions.

In a further exemplary embodiment, the first leg includes a horizontal segment extending along a portion of the intermediate conductive segment, the first leg intersecting the first conductive segment at a first end of the portion and intersecting the second conductive segment at a second end of the portion.

In one exemplary embodiment, the first leg intersects the intermediate conductive segment using a first via that extends at least partway from the first conductive segment to the intermediate conductive segment, and intersects the second conductive segment using a second via that extends at least partway from the intermediate conductive segment to the second conductive segment.

In another exemplary embodiment, the crack detection ring includes a first portion of the first conductive segment and a second portion of the first conductive segment, wherein the first portion and the second portion are offset from each other by a distance of 250 nm or less.

In a further exemplary embodiment, the first leg includes a horizontal portion that includes a first horizontal segment and a second horizontal segment, wherein the first horizontal segment and the second horizontal segment intersect different layers of the die.

In one exemplary embodiment, the serpentine path further includes a second leg that is adjacent to the first leg, wherein a first intersection for the first leg is horizontally offset in a first direction relative to a second intersection for the first leg, and, a first intersection for the second leg is horizontally offset in second direction, opposite to the first direction, from a second intersection for the second leg.

In another exemplary embodiment, for the first leg and the second leg, an intermediate intersection is horizontally centered between the first intersection and the second intersection.

In a further exemplary embodiment, the first leg and the second leg are positioned to resemble opposing sides of a first trapezoid, and a third leg and fourth leg of the serpentine path, adjacent to the first leg and the second leg, are positioned to resemble opposing sides of a second trapezoid that is vertically flipped in relation to the first trapezoid.

In one exemplary embodiment, a system includes a die and an integrated circuit intersecting a first conductive segment of a die, a second conductive segment of the die, and an intermediate conductive segment, between the first conductive segment and the second conductive segment of the die, and a crack detection ring that substantially surrounds the integrated circuit according to a serpentine path, each leg of which non-linearly intersects each of the conductive segments.

In another exemplary embodiment, at least one of the legs includes a horizontal portion extending along a portion of the intermediate conductive segment, wherein a first intersection of the leg with the first conductive segment is vertically aligned with a first end of the portion and a second intersection of the leg with the second conductive segment is vertically aligned with a second end of the portion.

In a further exemplary embodiment, each of the legs include a horizontal portion that includes a first horizontal segment and a second horizontal segment, wherein the first horizontal segment and the second horizontal segment intersect different layers of the die.

In an additional exemplary embodiment, for a first leg of the legs, a first intersection of the first leg with the first conductive segment is horizontally offset in a first direction relative to a second intersection of the first leg with the second conductive segment and, for a second leg of the legs that is adjacent to the first leg, a first intersection of the second leg is horizontally offset in second direction, opposite to the first direction, from a second intersection of the second leg.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope; the disclosure is described and explained with additional specificity and detail through the use of the accompanying drawings, in which.

DETAILED DESCRIPTION

Figure 1:
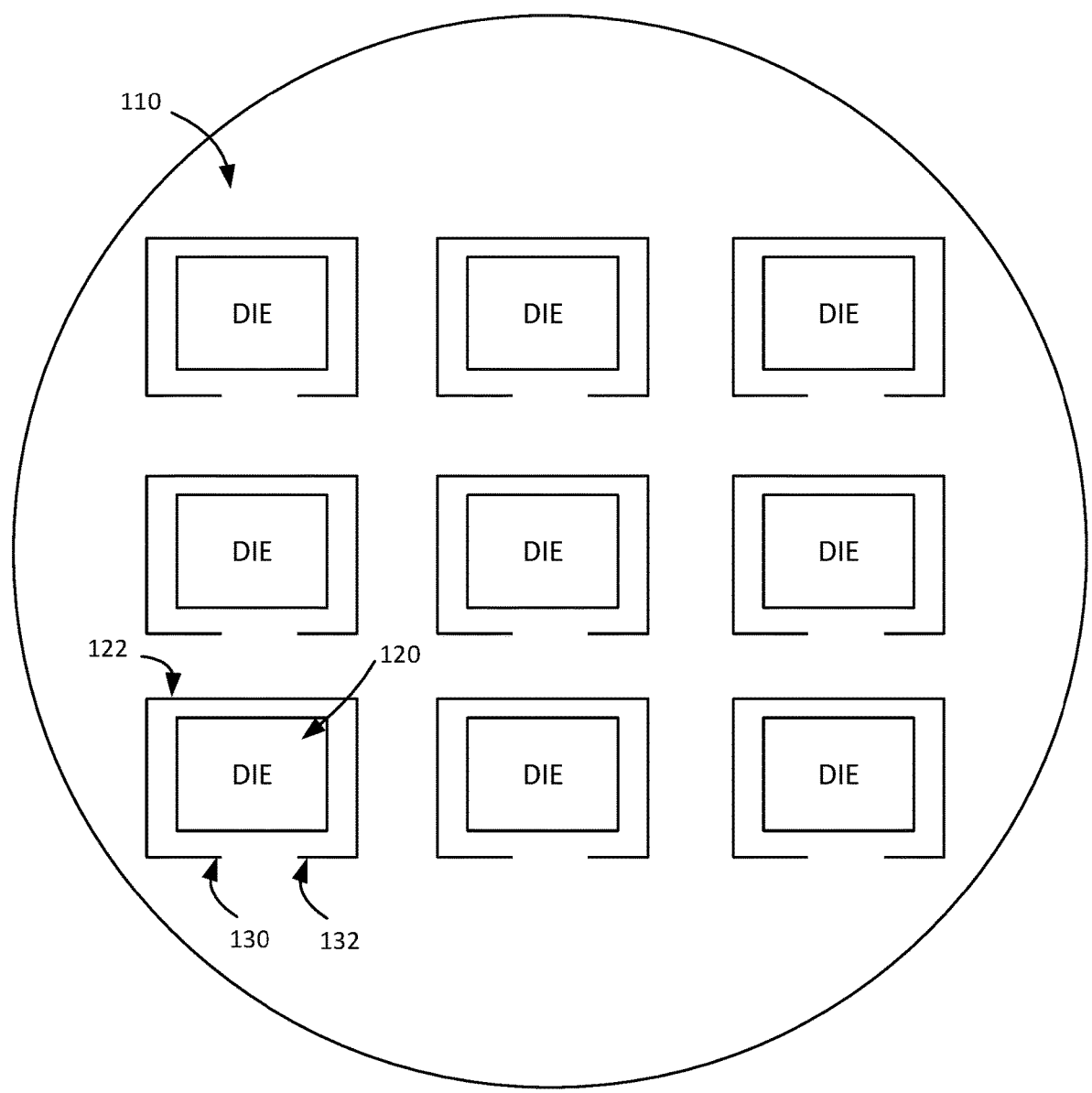
FIG. 1 is an illustration depicting one exemplary embodiment of a wafer.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits, off-the-shelf semiconductors such as logic chips, transistors, or other discrete devices, and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e. g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits, off-the-shelf semiconductors such as logic chips, transistors, or other discrete devices, and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," "in an exemplary embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

According to certain exemplary embodiments, this disclosure is directed to a semiconductor device including: a semi-conductor die having a central region and a peripheral region surrounding the central region. A semiconductor integrated circuit may be formed in the central region; and a three-dimensional crack detection ring may be formed in the peripheral region to surround the central region. In another exemplary embodiment, the crack detection ring extends in a vertical direction that is perpendicular to a row direction and a column direction.

According to other exemplary embodiments, this disclosure is directed to a semiconductor device including: semiconductor dies stacked in a vertical direction, each of the semiconductor dies having a central region and a peripheral region surrounding the central region; a plurality of semiconductor integrated circuits formed in the central regions of the semiconductor dies; and a crack detection ring formed in the peripheral regions of the semiconductor dies to surround the central regions, the crack detection ring extending in the vertical direction to cover the plurality of semiconductor dies.

According to certain embodiments, this disclosure is directed to a semiconductor device with a semi-conductor die including a first conductive segment and a second conductive segment below the first conductive segment and a central region and a peripheral region surrounding the central region. The semiconductor device may also include a semiconductor integrated circuit formed in the central region; and a crack detection ring formed in a ring shape in the peripheral region to surround the central region. The crack detection ring may extend perpendicular to a row direction and a column direction, wherein the crack detection ring includes a conduction loop that extends in the vertical direction between the first conductive segment and the second conductive segment.

In other exemplary embodiments, the nonvolatile storage device is implemented to include the crack detection ring. As dies are constructed on a wafer, each may include a crack detection ring as described herein. In one exemplary embodiment, a separate and distinct system is configured to apply the various voltages and/or currents to the crack detection ring as one skilled in the art may appreciate.

Although views and/or perspective views of some cross-sectional view(s) may not be shown, the cross-sectional view(s) of structures illustrated herein provide support for device structures that extend along different directions as would be illustrated in a plan view and/or in different directions as would be illustrated in a perspective view. The various directions may or may not be orthogonal. The three different directions may include a third direction that may be orthogonal to the two different directions. The plurality of device structures may be integrated in a same electronic device. For example, when a device structure is illustrated in a cross-sectional view, a device may include a plurality of the device structures, as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore. A passive electrically conductive component physically connected to a passive electrically insulative component (e.g. a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such. Directly electrically connected components do not include components electrically connected through active elements, such as transistors or diodes. Directly electrically connected elements may be directly physically connected and directly electrically connected.

The semiconductor devices described herein may be a semiconductor memory chip or semiconductor logic chip, a stack of such chips, a semiconductor package including a package substrate and one or more semiconductor chips, or a package-on-package device. In the case of memory, the semiconductor device may be part of a volatile or non-volatile memory. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

The various pads of a device described herein may be conductive terminals connected to internal wiring of the device and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal. such as a bump or solder ball, and/or an external wiring.

The crack detection ring may be formed in the peripheral region. The crack detection ring may be expanded or may extend in a vertical direction that is perpendicular to a row direction and a column direction and may be formed in a ring shape in the peripheral region to surround the central region. For example, the crack detection ring may have a shape that encloses or encircles the central region. The crack detection ring may extend in the vertical direction, as well as in two different horizontal directions. In some exemplary embodiments, the semiconductor die may include a first conductive segment and a second conductive segment below the first conductive segment, and portions of the first and second conductive segments may be in the central region and portions of the first and second conductive segments may be in the central and peripheral regions.

In some exemplary embodiments, the semiconductor device may include a single semiconductor die. In this case, the crack detection ring may be expanded in the vertical direction within the single semiconductor die. In some exemplary embodiments, the semiconductor device may include a plurality of semiconductor dies. In this case, the crack detection ring may be expanded in the vertical direction to cover the plurality of the semiconductor dies. In one exemplary embodiment, the crack detection ring proceeds between NAND planes, NAND Blocks, NAND sub-blocks or the like. In this example, as the size of an integrated circuit increases, the probability of internal stresses causing a crack increases. Thus, a crack detection ring that proceed through an internal path may detect such internal cracks.

In another exemplary embodiment, a crack detection ring may include a single conduction loop, or ring, that provides a continuous electrical connection. The semiconductor die may include a first conductive segment and a second conductive segment that is provided under the first conductive segment. The first and second conductive segments may be horizontal to a surface of the semiconductor die. The conductive segments may be formed in a layer in which metal line segments are patterned and/or a polysilicon layer in which polysilicon line segments are patterned. The conduction loop may be expanded in the vertical direction between the first conductive segment and the second conductive segment. The conduction loop may extend in a vertical direction that is perpendicular to the first and second conductive segments.

As one skilled in the art may appreciate, a plurality of layers may be formed on the wafer wherein, each of the layers include a plurality of conductive segments arranged in a wide variety of different configurations according to the type of die being formed. Thus, each of the layers of the die include many conductive segments that may be part of the crack detection ring as described herein.

The conduction loop may include a plurality of top horizontal line segments formed in the first layer of the die, a plurality of bottom horizontal line segments formed in the second layer of the die, and a plurality of vertical legs connecting the top horizontal line segments and the bottom horizontal line segments respectively to form the conduction loop. The top horizontal line segments and the bottom horizontal line segments may be perpendicular to the vertical legs, which may provide an electrical connection between the top horizontal line segments and the bottom horizontal line segments. In certain embodiments, the vertical legs are formed from multiple horizontal line segments stacked on each other.

The top horizontal line segments, the bottom horizontal line segments HLB and the vertical legs VL may be disposed alternatively along the conduction loop and may connect an input end node ENI and an output end node in the ring shape to surround the central region of the semiconductor die.

In some exemplary embodiments, the input end node and the output end node may be connected to input-output pads formed on a surface of the semiconductor die so that the conduction loop may be connected to an external tester through the input-output pads. In some exemplary embodiments, the input end node and the output end node may be connected to a crack test circuit formed in a portion of the central region of the semiconductor die.

Figure 9:
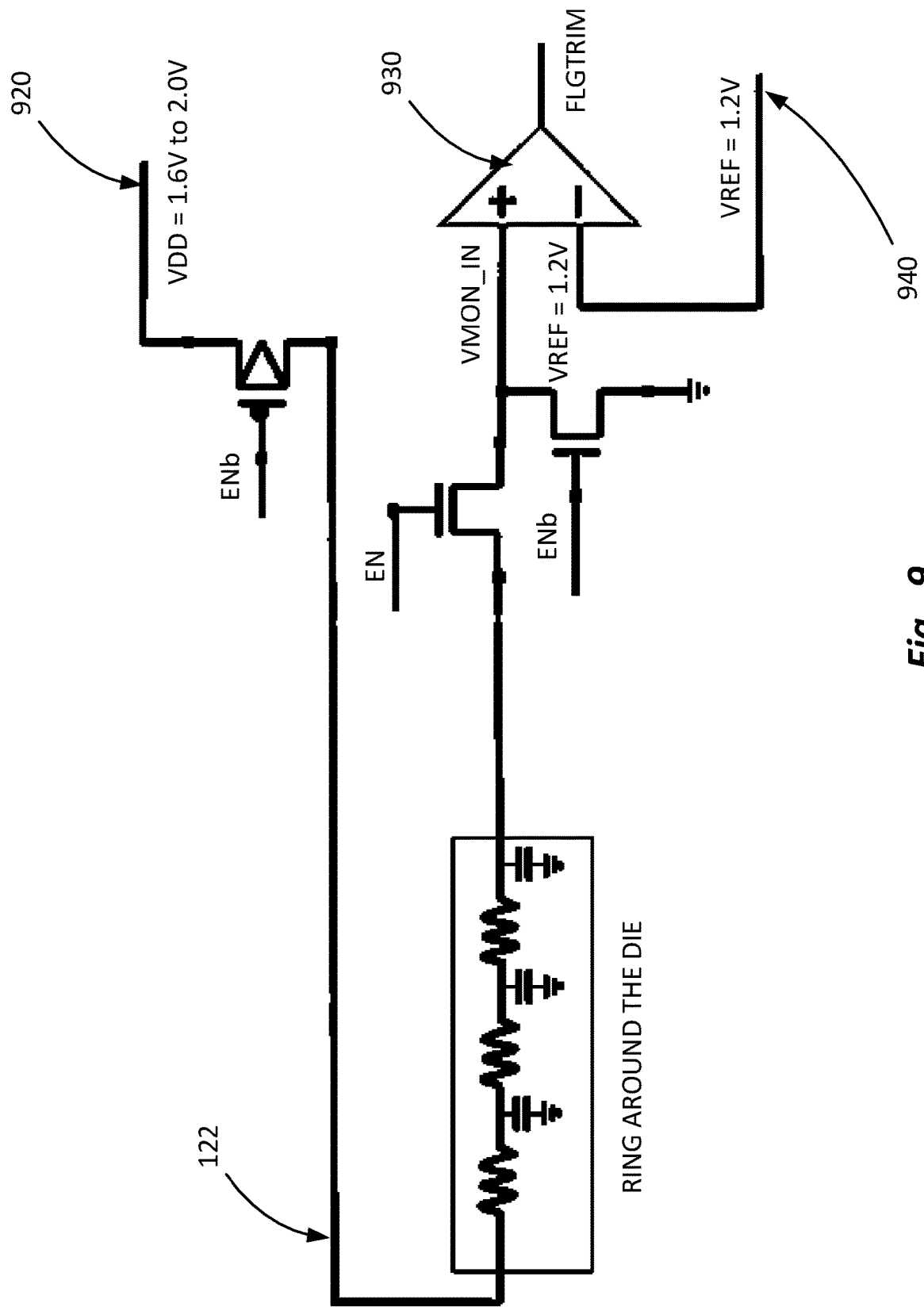
FIG. 9 is an illustration depicting an electrical circuit for testing a crack detection ring, according to one exemplary embodiment.

In some exemplary embodiments, the input end node and the output end node may be connected to input-output pads formed on a surface of the semiconductor die so that the conduction loop may be connected to an external tester through the input-output pads. In some exemplary embodiments, the input end node and the output end node ENO may be connected to a crack test circuit formed in a portion of the central region of the semiconductor die. On exemplary embodiment of a crack test circuit is depicted in FIG. 9.

In the embodiment, the first conductive segment may correspond to an upper-most layer among the layers that are formed over the semiconductor substrate (e.g., a wafer), and the second conductive segment may correspond to a polysilicon layer that is formed between the semiconductor substrate and the upper-most layer. The vertical legs may include vertical contacts to provide an electrical connection between the metal line patterns in the upper-most conductive segment and the polysilicon line patterns in the bit-line polysilicon layer. The vertical legs may further include conduction line patterns.

FIG. 1 is an illustration depicting one exemplary embodiment of a wafer 110. In one exemplary embodiment, the wafer 110 is used in a semiconductor device fabrication process that creates multiple dies 120. In one example, fabrication of the semiconductor device comprises a multiple-step sequence of photolithographic and/or chemical processing steps that gradually creates various electronic circuits on the wafer 110.

In certain embodiments, the die 120 is one of a memory device, a controller, a memory array, a circuit, an SOC (system on a chip), a processor, an apparatus, a system, or the like. In one exemplary embodiment, dies 120 on the wafer 110 are fabricated using various cycles of deposition, removal, patterning, and modification of electrical properties. Deposition may include transferring material (e.g., metals, metal oxides, silicon) to the wafer using physical vapor deposition, chemical vapor deposition, electrochemical deposition, molecular beam epitaxy, atomic layer deposition, or the like.

In another exemplary embodiment, removal includes wet or dry etching, or chemical-mechanical planarization. Patterning may include shaping or altering the deposited materials which may also be referred to as lithography. In one example, the wafer 110 is coated with a photoresist, then a machine moves a mask to expose portions of the wafer to short wavelength light and the remaining photoresist is removed by plasma ashing.

In one exemplary embodiment, the modification of electrical properties includes doping transistor sources and/or drains, annealing serves to activate dopants, reduction of dielectric constant in insulators, exposure to light, oxidation or fabrication of transistors. Of course, one skilled in the art may recognize other semiconductor manufacturing processes and this disclosure is meant to include all such processes.

In one exemplary embodiment, the manufacturing steps are repeated to fabricate many layers on the wafer. The layers may include conductive segments as will be further described. Thus, in certain embodiments, the dies 120 formed on the wafer may include multiple (e.g., 11 or more) conductive segments that are vertically connected in different ways as will be described in subsequent paragraphs.

In another exemplary embodiment, conductive crack detection rings 122 are formed on the wafer 110 and substantially surround each of the one or more of the dies 120. In one exemplary embodiment, the conductive crack detection ring 122 substantially surrounds two or more dies 120. Thus, in one exemplary embodiment, the crack detection ring 122 may be positioned around the die to form a border. In one exemplary embodiment, the crack detection ring 122 is formed as part of the die 120. In another embodiment, the crack detection ring 122 is formed as part of, or during one or more processes that also form the die 120.

In one exemplary embodiment, vertical legs of the crack detection ring 122 that surrounds the die 120 intersect the various conductive segments. In another exemplary embodiment, the crack detection ring 122 terminates at two end-points 130,132. In one exemplary embodiment, the endpoints 130, 132 are configured to substantially surround the die 120 and be connected to a testing system. As will be further described in later paragraphs, the crack detection ring 122 may follow a serpentine path having a plurality of legs, each of which intersect many conductive segments of the die 120.

In some embodiments, the first conductive segment is formed as part of an upper layer that is formed after other layers of the die 120, the second conductive segment is formed as part of a lower layer that is formed before other layers of the die 120, and an intermediate conductive segment is part of an intermediate layer of the die 120 that is formed between the upper layer and the lower layer. In one exemplary embodiment, the second conductive segment is formed as part of a lowest layer of the die, the first conductive segment is formed as part of a highest layer of the die, and the intermediate layer is formed in any layer between the highest layer and the lowest layer.

In this exemplary embodiment, each of the plurality of legs of the crack detection ring intersects each of the three conductive segments. In other exemplary embodiments, the die 120 includes many more conductive segments (e.g., 10 or more), and each of the plurality of legs of the crack detection ring intersects each of the conductive segments. In another exemplary embodiment, one of the legs intersects a conductive segment in each of the layers of the die.

In one exemplary embodiment, the second conductive segment may be a bottom metal conductive segment and may be fabricated as part of a second conductive segment, the intermediate conductive segment is fabricated as part of an intermediate conductive segment on the wafer 110, and the first conductive segment may be a metal conductive segment that is fabricated above the intermediate conductive segment. In another exemplary embodiment, the intermediate conductive segment is formed in any layer of the die between the second conductive segment and the first conductive segment.

As used herein, a conductive segment refers to a conductive structure of material that is formed as part of a layer on the wafer and conducts electrical current. Conductive materials may include metals (e.g., gold, copper, etc.), non-metals (e.g., silicon, doped silicon, etc.), or other, or the like, as one skilled in the art may appreciate. A conductive segment may comprise one or more conductive structures designed to convey electric current and/or voltage from one part of an integrated circuit to another. These conductive structures may comprise traces, leads, nanowires, sheets of conductive material, or the like. Those of skill in the art will recognize the variety of conductive structures that a conductive segment may include.

As will be further described in later paragraphs, a serpentine path may include the crack detection ring following a variety of different pathways (when viewed in cross-section or other specific perspective), where the crack detection ring repeatedly proceeds through the first and second conductive segments. Of course, it is not necessary that each of the plurality of legs intersect segments in every layer of the die.

In one exemplary embodiment, the die includes any of a variety of circuit types besides memory circuits, including but not limited to processors, power circuits, sensor circuits, relay circuits, and/or the like.

Figure 2:
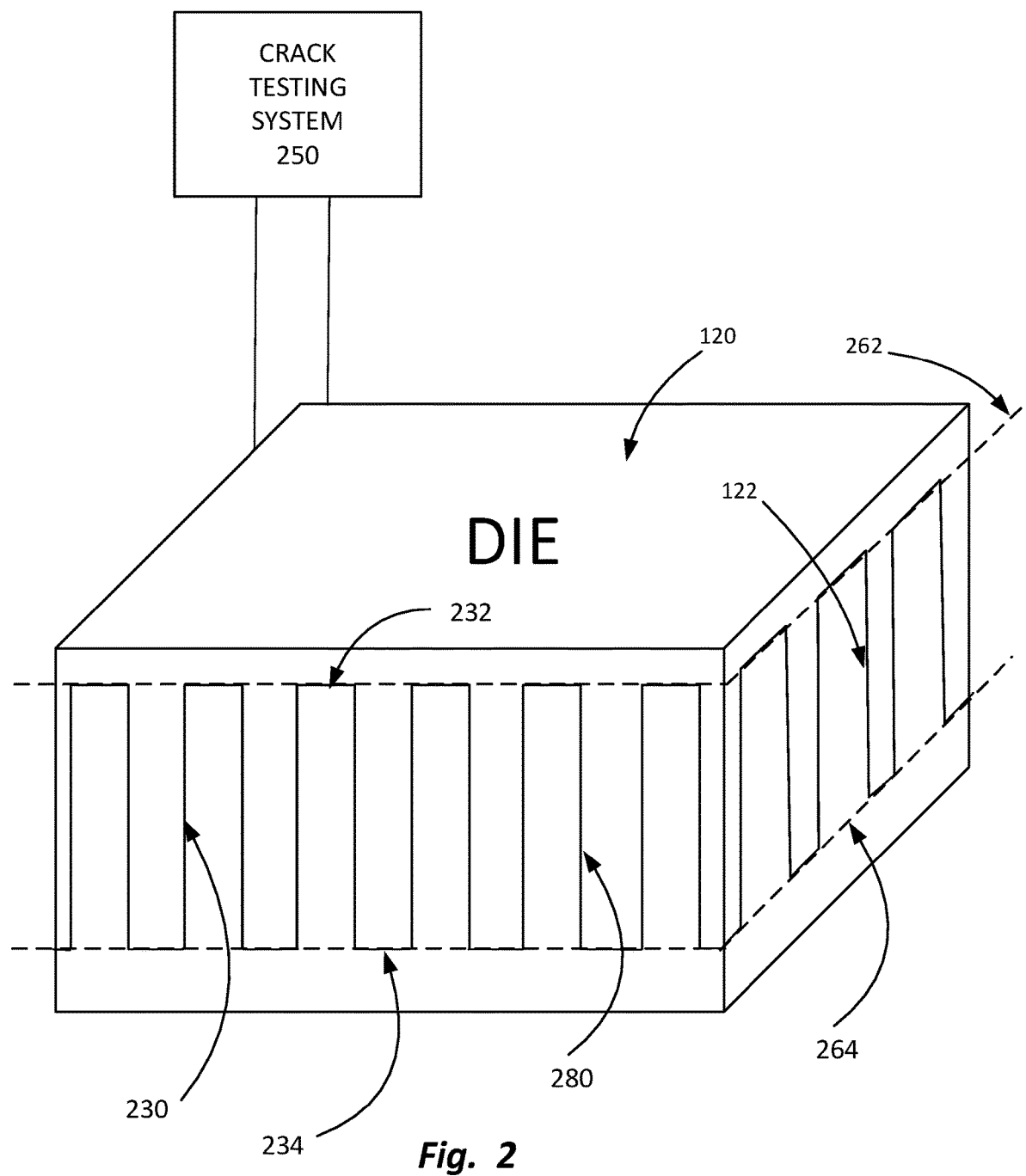
FIG. 2 is an illustration depicting an exemplary embodiment of a crack detection ring.

FIG. 2 is an illustration depicting a crack detection ring 122 surrounding a die 120, according to one exemplary embodiment. In one exemplary embodiment, the crack detection ring 122 substantially surrounds the die 120 by repeatedly proceeding from a first conductive segment 262 to a second conductive segment 264 and back to the first conductive segment 262.

In another exemplary embodiment, as the crack detection ring 122 weaves up and down through conductive segments in the different layers of the die according to a serpentine path 280. As used herein, a serpentine path 280 means that the crack detection ring 122 follows a path around the die 120 wherein the crack detection ring 122 repeatedly proceeds up and down through many layers of the die 120 as it proceeds around, or circumscribes, the die 120. Said another way, a serpentine path is a path that proceeds in between layers according to an "S" shape, much like the shape of a snake.

In another exemplary embodiment, vertical legs 230 of the crack detection ring 122 intersect each of the conductive segments between the first conductive segment 262 and the second conductive segment 264. In one exemplary embodiment, a first horizontal segment 232 of the crack detection ring 122 traverses within the first conductive segment 262 and a second horizontal segment 234 of the crack detection ring 122 traverses within the second conductive segment 264 of the die 120.

In certain embodiments, a crack testing system 250 applies a voltage source to one end of the crack detection ring 122 and measures a voltage or current at a second end of the crack detection ring 122 as will be further described.

Figure 3:
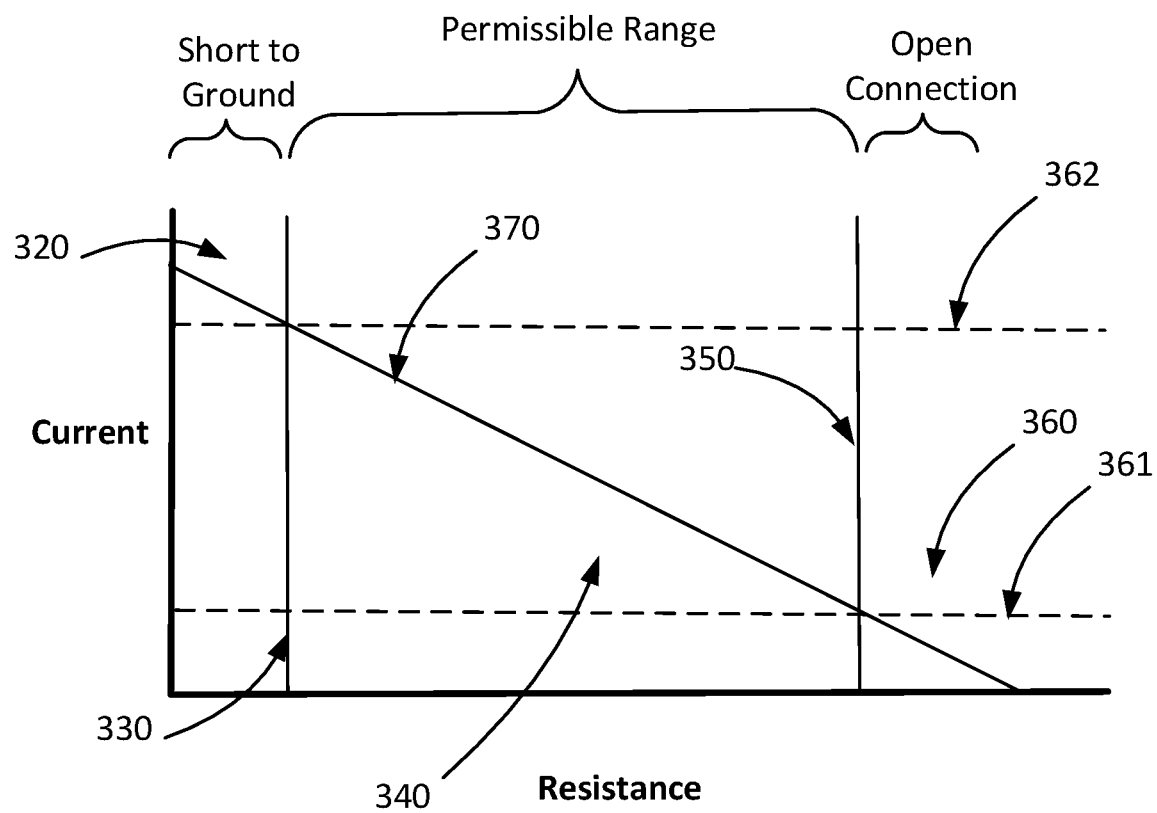
FIG. 3 is a chart representing a relationship between resistance and current of a crack detection ring, according to another exemplary embodiment.

FIG. 3 is a chart representing a relationship between resistance and current of a crack detection ring, according to another exemplary embodiment. According to this exemplary embodiment, the crack testing system 250 applies an electrical signal to a first end 130 of the crack detection ring and measure one or more electrical properties of the crack detection ring 122 at the second end 132.

In one exemplary embodiment, the crack testing system 250 applies an electrical power source to the first end 130 and measures resistance and/or current at the second end. As indicated in FIG. 3, varying values of resistance and/or current indicate whether the crack detection ring 122 is damaged. As used herein, a damaged crack detection ring 122 means the crack detection ring 122 has been physically malformed such that one or more electrical characteristics of the crack detection ring have been altered (e.g., a different resistance value.) In certain exemplary embodiments, a damaged crack detection ring 122 is broken, severed, bent, twisted, cut, smashed, or the like. In one example embodiment, a broken crack detection ring 122 cannot conduct electrical current between the first end 130 and the second end 132.

FIG. 3 depicts a plot of current and resistance. The line 370 represents a relationship between resistance and current. In one exemplary embodiment, when there is a significant crack in the die 120, the crack detection ring 122 is also broken so there is high resistance (e.g., an open connection). The high resistance area 360 of the plot represents a crack detection ring 122 with very high resistance (e.g., resistance above a high resistance threshold 350) with low current (e.g., current below a low current threshold 361.

In another exemplary embodiment, the crack detection ring 122 is damaged so that a portion of the crack detection ring 122 is shorted to ground. In this exemplary embodiment, high current will flow from a power source, through the crack detection ring 122, then to ground. The crack testing system measures current above the high current threshold 362. This exemplary embodiment is represented by area 320 of FIG. 3 indicating resistance below a low resistance threshold 330 and current above a high current threshold 362.

In one exemplary embodiment, the crack detection ring 122 is not damaged or broken. In this exemplary embodiment, the measured resistance value is above the low resistance threshold 330 and below the high resistance threshold 350. Furthermore, in this exemplary embodiment, the measured current value is above the low current threshold 361 and below the high current threshold 362. In this exemplary embodiment, the measured resistance and current are in a permissible range 340. Thus, by measuring resistance and/or current through the crack detection ring 122, a crack testing system 250 determines whether the crack detection ring is damaged or broken.

In one exemplary embodiment, a crack is a deformed section of a one or more layers on the wafer 110 that intersects at least a portion of the die. In one example, the crack alters the electrical characteristics of the die such that the die may no longer perform as expected. In one example, a crack causes an electrical short with a conductive segment.

In another example, a crack causes a disconnect of electrical components (e.g., a conductive segment in a layer). In still another exemplary embodiment, a crack interferes with an electrical ring around the die but does not necessarily interfere with the functionality of the die.

As used herein, a crack is a break, opening, weakened portion, or partial separation of one portion of a conductive segment from another portion of the conductive segment. In exemplary embodiments, a crack is a break, a fissure, or other, or the like, as one skilled in the art may appreciate.

Figure 4:
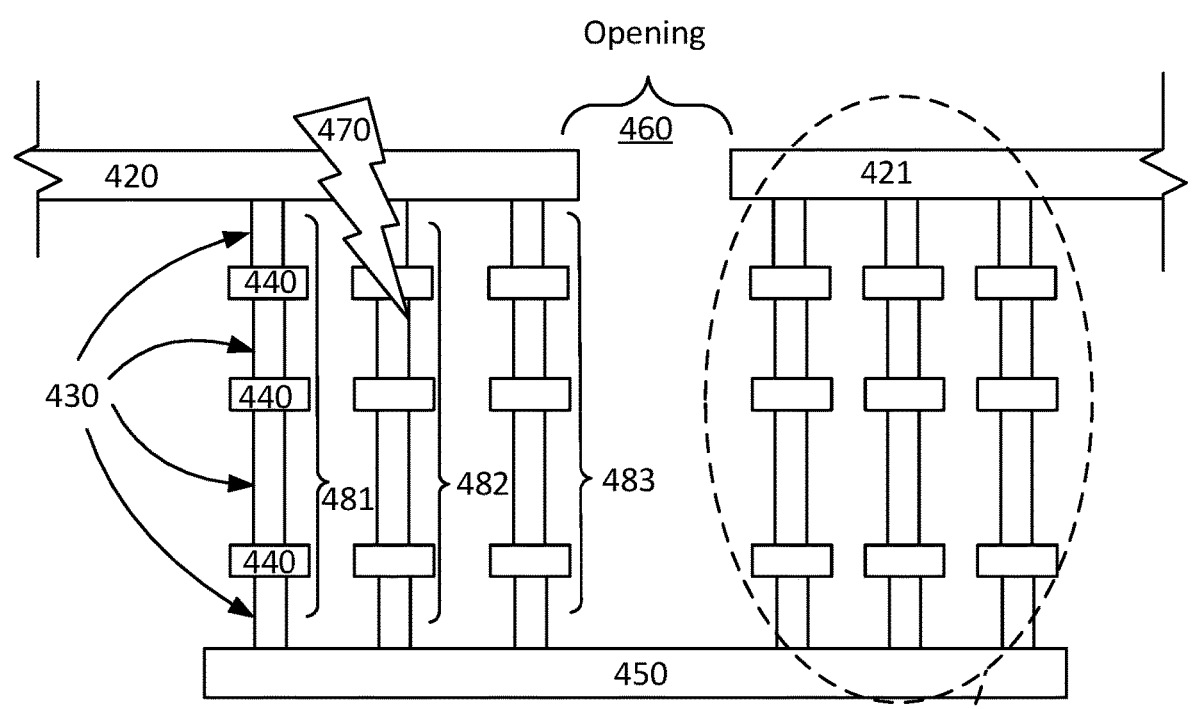
FIG. 4 is an illustration depicting one portion of a crack detection ring, according to one exemplary embodiment.

FIG. 4 is an illustration depicting one portion of a crack detection ring 122, according to one exemplary embodiment. In one exemplary embodiment, the crack detection ring 122 includes a plurality of legs (e.g., leg 490) that extend from a first conductive segment 421 to a second conductive segment 450. In another exemplary embodiment, each leg 490 includes multiple leg-sections (e.g., leg-sections 481, 482, 483). As described in later paragraphs, the leg 490 proceeds from a first conductive segment 421 to a second conductive segment 450.

In certain exemplary embodiments, the leg-sections 481, 482, 483 are separated to provide additional coverage for the detection of cracks. In another exemplary embodiment, each of the leg-sections 481, 482, and 483 intersect each of the conductive segments 440 in the die as they proceed from the first conductive segment 420 to the second conductive segment 450. In one exemplary embodiment, a leg-section includes vias 430 that connect between each of the conductive segments 440 between the first conductive segment 420/421 and the second conductive segment 450.

In another exemplary embodiment, a crack 470 breaks the leg-section 482 but does not break the leg-section 481 or 483. In this exemplary embodiment, electrical current may still flow through the crack detection ring 122 because leg-section 481 remains undamaged. In another exemplary embodiment, because leg-section 482 is severed and a resistance value for the crack detection ring is increased, as one skilled in the art may appreciate.

In one exemplary embodiment, each vertical leg of the serpentine path includes 3 separate leg-sections 481, 482, 483. A crack that intersects with the high opening 460 and does not intersect with the ring does not alter the electrical properties of the ring and would not be detected. A crack that intersects less than 3 of the leg-sections of a vertical leg may also not interrupt current flow through the ring and may not be detected because current would still flow through an unbroken leg-section. Thus, in this exemplary embodiment, the ring configuration depicted in FIG. 4 may not detect cracks that intersect with the high opening or the vertical legs when the cracks do not disconnect each of the vertical leg-sections of a leg of the crack detection ring 122.

In one exemplary embodiment, a crack 470 occurs from an edge of the die through the first conductive segment 420 between a first leg-section 481 of a vertical leg and a third leg-section 483 of the vertical leg and disconnects the second leg-section 482 of the vertical leg. In this exemplary embodiment, the first leg-section 481 of the vertical leg and the third leg-section 483 of the vertical segment remain intact. In response to a voltage and current source being applied to one end of the crack detection ring 122, current will still flow through the crack detection ring 122 because the current may still flow through the first leg-section 481 and/or the third leg-section 583 of the vertical leg. Thus, the crack may not be not detected.

Figure 5:
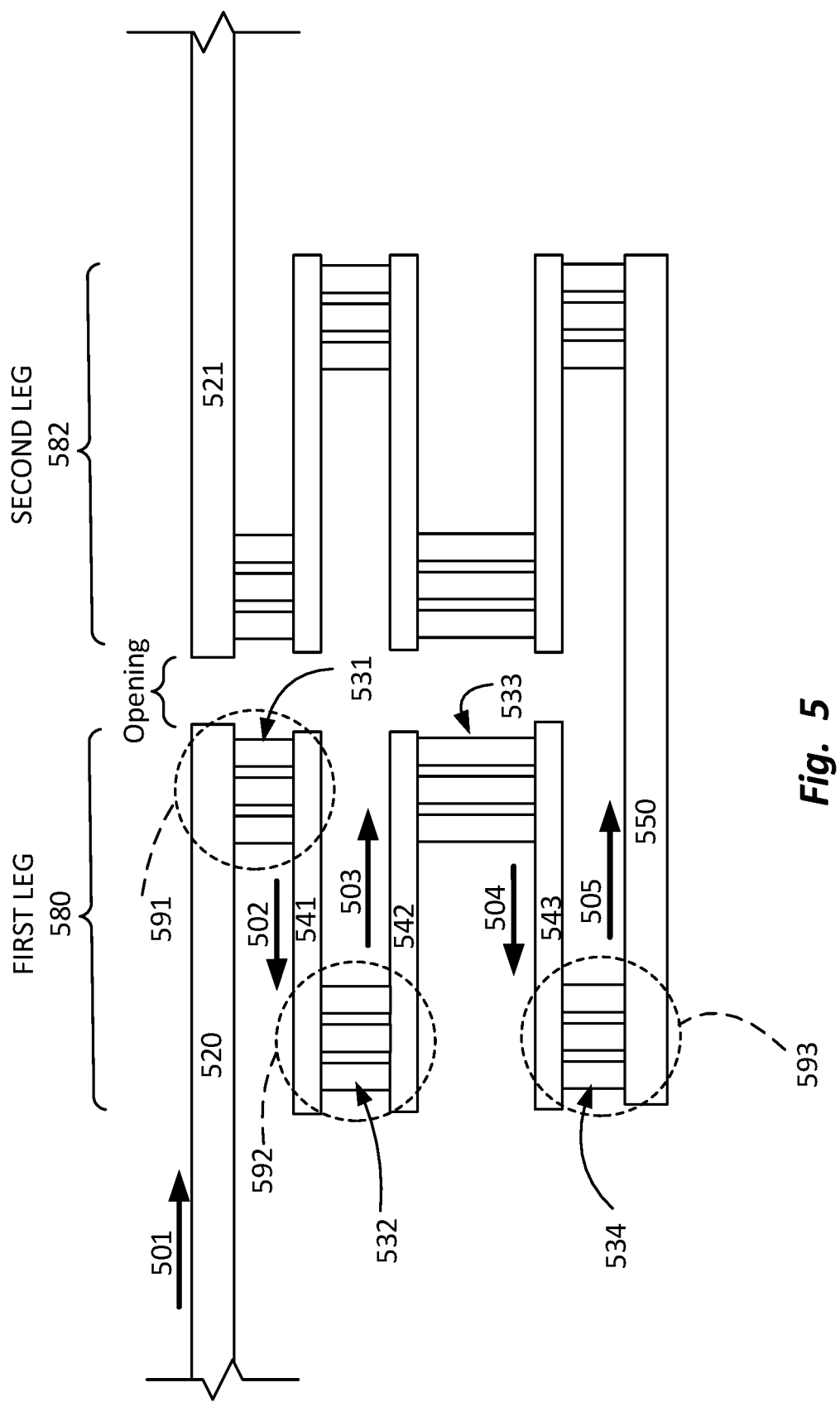
FIG. 5 is an illustration depicting one portion of a crack detection ring according to another exemplary embodiment.

FIG. 5 is an illustration depicting one portion of a crack detection ring according to another exemplary embodiment. In this exemplary embodiment, instead of three separate leg-sections 481, 482, 483, the leg of the crack detection ring 122 proceeds through conductive segments 520, 541, 542, 543, 550.

In one exemplary embodiment, a first leg the crack detection ring 122 includes a first leg 580 that proceeds from a first conductive segment 520 to a second conductive segment 550. In this exemplary embodiment, the first leg 580 proceeds through a first intermediate conductive segment 541, a second intermediate conductive segment 542, and a third intermediate conductive segment 543.

In another exemplary embodiment, vias 531 connect a first conductive segment 520 with the first intermediate conductive segment 541 at a first intersection 591 located on one end of the first intermediate conductive segment 541. Furthermore, vias 532 connect the first intermediate conductive segment 541 with the second intermediate conductive segment 542 at an intermediate intersection 592 located on an opposite end of the first intermediate conductive segment 541. Additionally, vias 533 connect the second intermediate conductive segment 542 with the third intermediate conductive segment 543 and vias 534 connect the third intermediate conductive segment 543 with the second conductive segment 550 at a second intersection 593.

As used herein, an "intersection" is a location on the crack detection ring 122 where a part of the crack detection ring connects or couples to a conductive segment of the die. The conductive segment may define a portion of the crack detection ring. In one example embodiment, an intersection includes a location where a via connects to a segment of a conductive segment. In another example embodiment, an intersection includes a location where conductive matter electrically connects one conductive segment to another conductive segment. Thus, in certain exemplary embodiments, a first intersection is an intersection with a first conductive segment, an intermediate intersection is an intersection with an intermediate conductive segment, and a second intersection is an intersection with a second conductive segment.

A used herein, a via is an electrical connection between layers of a die that goes through the plane of one or more vertically adjacent layers. Vias may be formed by etching a hole from an upper layer to a lower layer and then depositing a conductor in the hole. While "via" conventionally means a hole or opening, as used herein via refers to the conductor that fills the hole. In certain exemplary embodiments, vias connect a conductive segment in one layer of the die with a conductive segment in a vertically adjacent layer.

In one exemplary embodiment, vias 531, 532, 533, and 534 connect to opposite sides of their respective intermediate conductive segments 541, 542, 543, so that a pathway followed by the first leg 580 includes two consecutive turns in alternating directions. As used herein, a pathway is a route that a structure, or combination of structures, follow(s) as one moves from one end of the structure to the other end. Examples of suitable pathways for the crack detection ring embodiments, described herein, include but are not limited to, s-shaped, serpentine, zig-zag, meandering, switch-backed, stepped, and/or the like.

As described herein, consecutive turns in alternating direction includes a pathway proceeding in a first horizontal direction for one conductive segment, then proceeding in a second horizontal direction that is opposite the first horizontal direction for a next conductive segment. In this example embodiment, the pathway proceeds initially along a direction 501, from the first conductive segment 520 to the first intersection 591, through the vias 531, along the first intermediate conductive segment 541 in an opposite direction 502 (e.g., a first turn in an alternating direction) and through the intermediate intersection 592, through the vias 532, along the second intermediate conductive segment 542 initially in a direction 503 (e.g., a second turn in an alternating direction), through the vias 533, along the third intermediate conductive segment 543 back in a direction 504 (e.g., a third turn in an alternating direction), through the second intersection 593, and through the second conductive segment 550, initially in a direction 505. As depicted in FIG. 5, this pathway includes four consecutive turns in alternating directions. In another exemplary embodiment, "consecutive turns" means that the directional turns in the crack detection ring alternate between a first direction and a second direction. In this example embodiment, the directional change from the direction 501 to the direction 502 is opposite the directional change from the direction 502 to the direction 503, and the directional change from the direction 503 to the direction 504 mirrors the directional change from the direction 501 to the direction 502. Thus, the directional change from the direction 501 to the direction 502, from the direction 502 to the direction 503, from the direction 503 to the direction 504, and from the direction 504 to the direction 505 are consecutive (e.g., there are no other different directional changes) and alternates (e.g., the directional changes alternate between a first direction and a second direction).

As indicated in FIG. 5, the intermediate intersection 592 between the first intermediate conductive segment 541 and the vias 532 is horizontally offset in relation to the first intersection 591 between the first conductive segment 520 and the vias 531. In another exemplary embodiment, the intermediate intersection 592 is horizontally offset in relation to the second intersection 593 between vias 534 and the second conductive segment 550.

In another exemplary embodiment, each leg 580, 582 of the crack detection ring 122 non-linearly intersects each of the conductive segments 520, 541, 542, 543, and 550. As described herein, non-linear intersection includes intersections between conductive segments in the first leg 580 being horizontally offset such that a single line cannot intersect the first intersection 591, the intermediate intersection 592 and the second intersection 593. In this way, a substantially linear crack cannot pass through the conductive segments without severing the crack detection ring 122.

In one exemplary embodiment, the first leg 580 includes a horizontal segment of the first intermediate conductive segment 541, the vias 531 being horizontally aligned with a first end of the first intermediate conductive segment 541, and the vias 532 being horizontally aligned with a second end of the first intermediate conductive segment 541. In this exemplary embodiment, a portion of the first leg 580 proceeds horizontally along the first intermediate conductive segment 541.

In another exemplary embodiment, a leg of the crack detection ring 122 includes a horizontal segment that extends along a portion of an intermediate conductive segment and intersects the first conductive segment 520 at a first end of the horizontal segment and intersects the second conductive segment 550 at a second end of the horizontal segment.

In one exemplary embodiment, the crack detection ring 122 includes a first portion of the first conductive segment 520 and a second portion of the first conductive segment 521, wherein the first portion of the first conductive segment 520 and the second portion of the first conductive segment 521 are offset from each other by a distance of at least 250 nanometers.

In another exemplary embodiment, three vias 531 are used to connect the first conductive segment 520 and the first intermediate conductive segment 541. In other exemplary embodiments, two or four vias are used at each of the intersections. Of course, other values may be used, and this disclosure is not limited in this regard.

In one exemplary embodiment, the vias 531, 532, 533, 534 between each of the intermediate conductive segments 541, 542, 543 are horizontally offset so that they do not vertically line up with the vias for other intermediate conductive segments. In another exemplary embodiment, the vias are shifted to one end of the segment in one layer and to the opposite side of the segment in a next layer. In this way, the detection capabilities of the ring are extended through the segment. In this exemplary embodiment, cracks that intersect the segment are detected by the system because they break the continuity of the ring (e.g. the die crack detection structure) or connect the ring with electrical ground as previously described.

Figure 6:
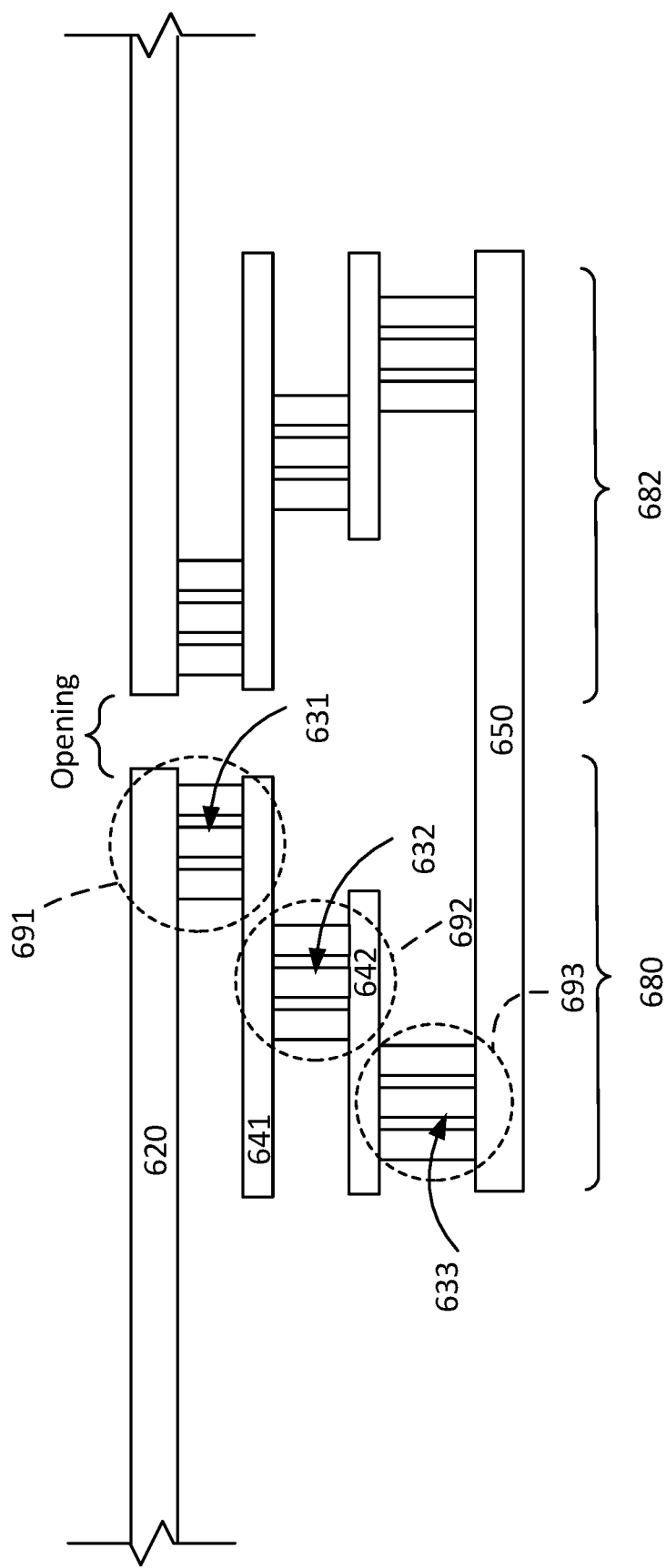
FIG. 6 is another illustration depicting a portion of a crack detection ring, according to one exemplary embodiment.

FIG. 6 is another illustration depicting a portion of a crack detection ring, according to one exemplary embodiment. In this exemplary embodiment, legs of the crack detection ring 122 intersects the conductive segments 620, 641, 642, and 650.

In another exemplary embodiment, vias 631 connect a first conductive segment 620 with the first intermediate conductive segment 641 at a first intersection 791 located on one end of the first intermediate conductive segment 641. Additionally, vias 633 connect the second intermediate conductive segment 642 with the second conductive segment 650 at a second intersection 693 and vias 632 connect the first intermediate conductive segment 641 with the second intermediate conductive segment 642 at an intermediate intersection 692 that is horizontally centered between the first intersection 691 and the second intersection 693. In this exemplary embodiment, the intermediate intersection 692 is horizontally offset from each of the first intersection 691 and the second intersection 693. In one exemplary embodiment, the vias 632 are located at a centralized portion of the first intermediate conductive segment 641.

In another exemplary embodiment, intersections 691, 692, 693 for a first leg 680 of the crack detection ring 122 are horizontally offset in a first direction and intersections for a second leg 682 are horizontally offset in an opposite direction. In another exemplary embodiment, the second leg 682 is adjacent to the first leg 680 with the respective intersections are horizontally offset in a second direction that is horizontally opposite to the first direction.

In one exemplary embodiment, a horizontal offset direction for the first leg 680 is substantially similar in magnitude to a horizontal offset direction for the second leg 682 such that the first leg 680 and the second leg 682 resemble opposing sides of a trapezoid. In another exemplary embodiment, the first leg 680 and the second leg 682 are closer together so as to resemble two sides of a triangle. In one exemplary embodiment, the second leg 682 is horizontally offset in the same direction as the first leg 680. In this exemplary embodiment, the first leg 680 and the second leg 682 are substantially parallel, and a third and fourth leg are similarly horizontally offset so as to be substantially parallel with the first leg 680 and the second leg 682.

In another exemplary embodiment, a third leg and fourth leg of the crack detection ring include intersections that are horizontally offset to resemble a trapezoid that horizontally mirrors the trapezoid of legs 680 and 682. In one exemplary embodiment, the third leg and the fourth leg of the crack detection ring include intersections that are horizontally offset to resemble a triangle that horizontally mirrors a triangle formed by legs 680 and 682.

Figure 6A:
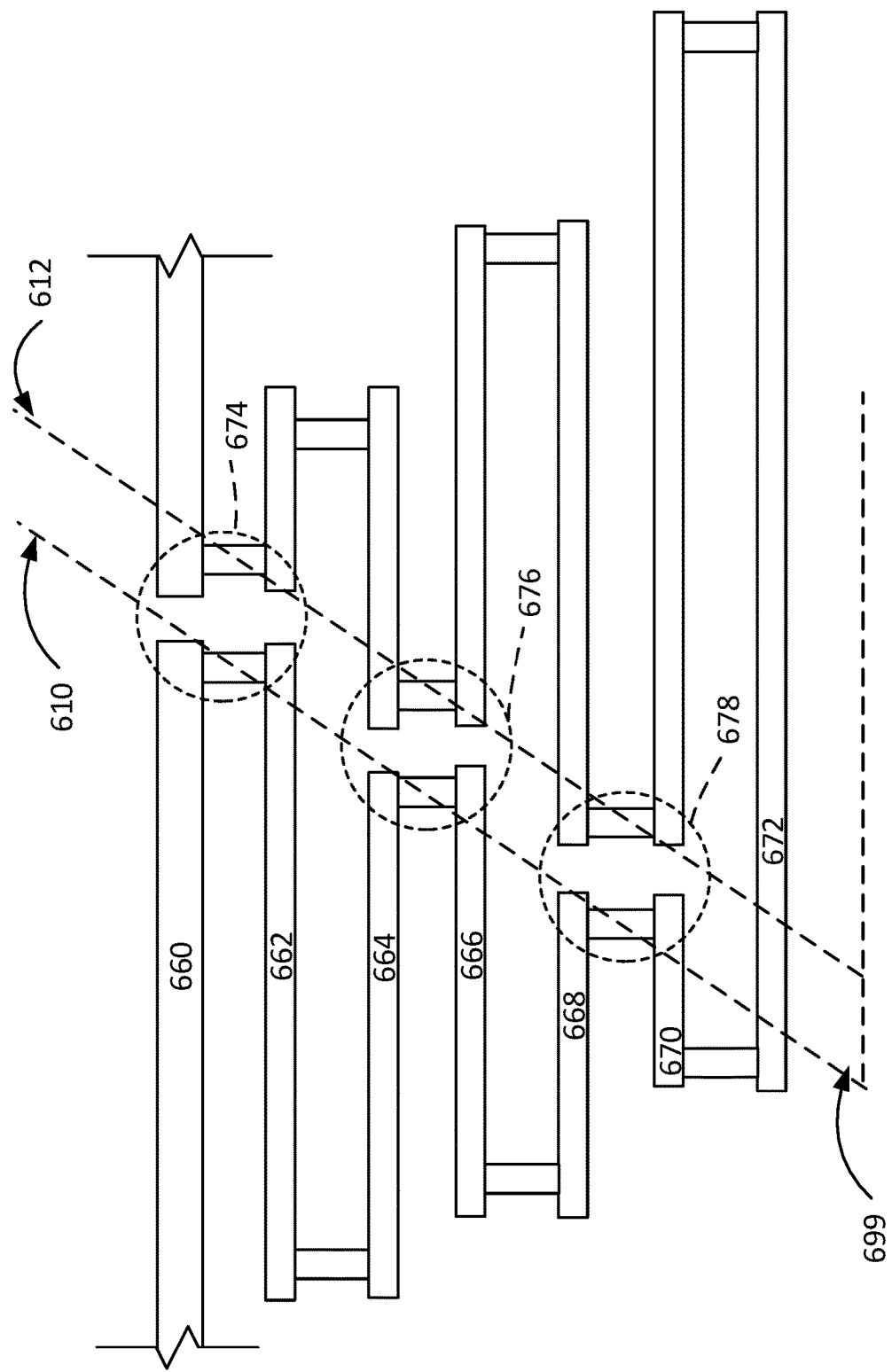
FIG. 6A is one illustration depicting a portion of a crack detection ring, according to another exemplary embodiment.

FIG. 6A is one illustration depicting a portion of a crack detection ring, according to another exemplary embodiment. In this exemplary embodiment, a die includes an integrated circuit that includes a first conductive segment 662, an intermediate conductive segment 666, and a second conductive segment 670.

In another exemplary embodiment, the intermediate conductive segment 666 is linearly located between the first conductive segment 662 and the second conductive segment 670. In one exemplary embodiment, the crack detection ring 122 intersects the first conductive segment 662 at a first intersection 674, intersects the second conductive segment 670 at a second intersection 678, and intersects the intermediate conductive segment 666 at an intermediate intersection 676. As indicated in FIG. 6A, the intermediate intersection 676 is between the first intersection 672 and the second intersection 678 and is horizontally offset in relation to the first intersection 674. In this exemplary embodiment, the second intersection 678 is also horizontally offset in relation to the first intersection 672 and the intermediate intersection 676. In one example embodiment, the second intersection 678 is horizontally offset to be linearly located with the first intersection 674 and the intermediate intersection 676.

In another exemplary embodiment, a leg 612 of the crack detection ring 122 passes through the first intersection 672, the intermediate intersection 676, and the second intersection 678 at an angle 699. In one example embodiment, a line intersecting the intersections 672, 674, 678 neighboring legs exceeds 45 degrees. However, this disclosure is not limited in this regard as any angle measurement between 0 and 180 degrees may be used.

In one exemplary embodiment and as depicted in FIG. 6A, the angle 699 is 45 degrees and a second leg 610 on one side of the leg is parallel (also 45 degrees) while a third leg on an opposite side of the leg is perpendicular to the leg (e.g., 135 degrees).

In another exemplary embodiment, legs 610, 612 of the crack detection ring 122 are parallel in pairs (e.g., neighboring legs of the crack detection ring that are configured to be at substantially the same angle with respect to the conductive layers of the die) with the respective pairs being at opposite angles. For example, a first pair of parallel legs 610, 612 for the crack detection ring 122 may be at a 50-degree angle, with a neighboring pair of parallel legs being at a 150-degree angle. In one exemplary embodiment, the respective pairs of legs of the crack detection ring are at varying angles. For example, a first pair of legs for the crack detection ring may be at 30 degrees, while a second pair of legs for the crack detection ring are at 57 degrees.

In another exemplary embodiment, the legs 610, 612 do not form straight lines, but proceed through the conductive segments and intersections 660, 662, 664, 666, 668, 670, 672 by alternating back and forth through the layers as depicted in FIG. 6A, thus making at least two consecutive turns in alternating directions.

Figure 7:
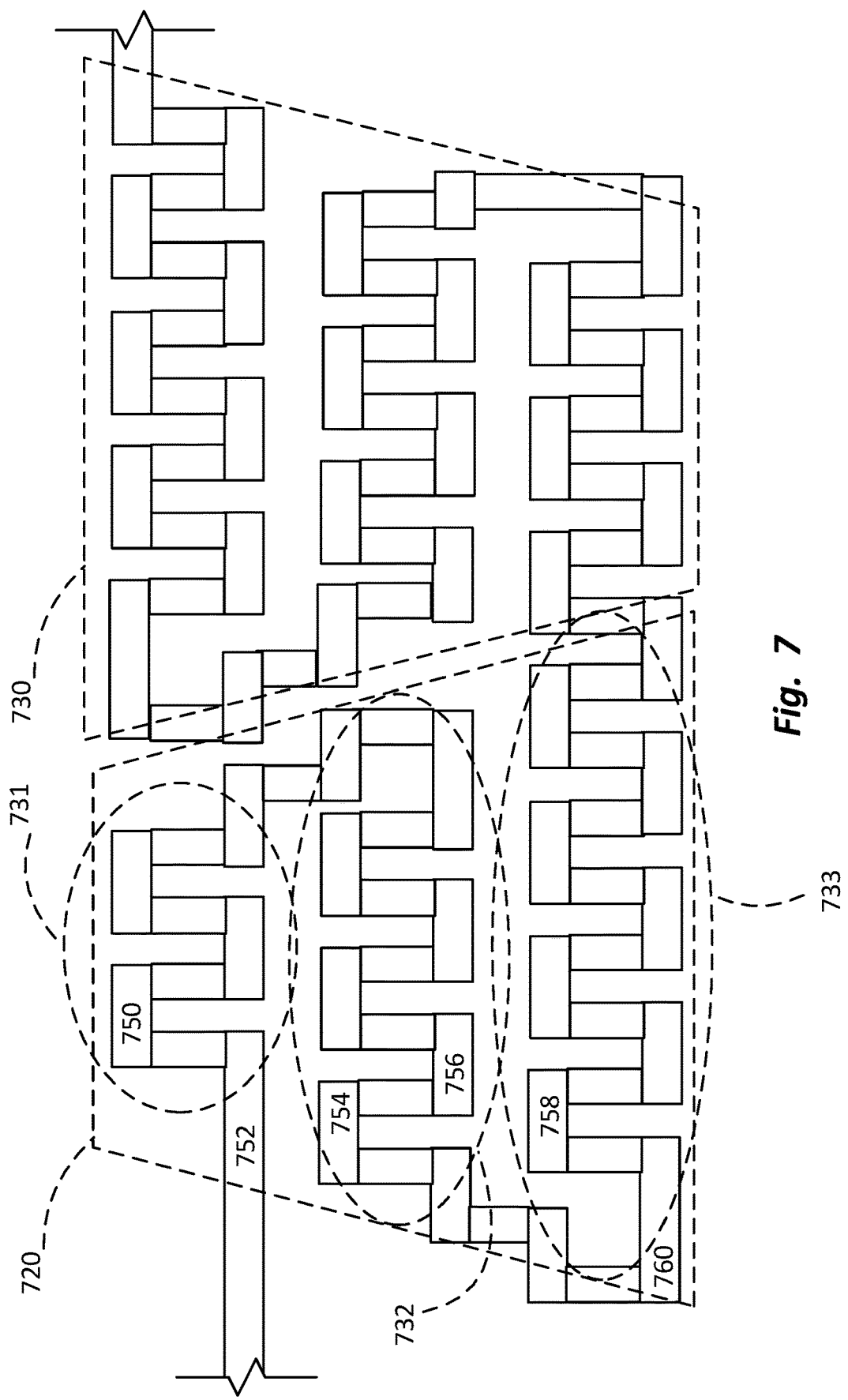
FIG. 7 is an illustration depicting another portion of a crack detection ring, according to one exemplary embodiment.

FIG. 7 is an illustration depicting another portion of a crack detection ring, according to one exemplary embodiment. In this exemplary embodiment, and similar to the crack detection ring 122 of FIG. 6, the respective legs form sides of a trapezoid 720, or a triangle as previously described. Furthermore, horizontal portions of the legs proceed from a first intermediate conductive segment 752 to a first conductive segment 750 and return to the first intermediate conductive segment 752. Furthermore, in a lower portion of the leg, a horizontal portion intersects both intermediate conductive segments 754 and 756. Thus, in certain embodiments, a horizontal portion of a leg of the crack detection ring 122 intersects two or more distinct conductive segments.

In one exemplary embodiment, a vertical leg of the crack detection ring 122 includes a first horizontal portion 731 that intersects with a first conductive segment 750 and a first intermediate conductive segment 752. In this exemplary embodiment, the crack detection ring 122 traverses from the first intermediate conductive segment 752 to the first conductive segment 750, then repeatedly traverses between the first intermediate conductive segment 752 and the first conductive segment 750 along the first horizontal portion 731.

In another exemplary embodiment, each traversal from the first intermediate conductive segment 752 to the first conductive segment 750 connects with separate sections of the first intermediate conductive segment 752 and the first conductive segment 750.

In this exemplary embodiment, the crack detection ring 122 then proceeds to a second intermediate conductive segment 756 and, as with the first conductive segment 750 and the first intermediate conductive segment 752, repeatedly traverses between a second intermediate conductive segment 754 and a third intermediate conductive segment 756 along an intermediate portion 732.

In one exemplary embodiment, the crack detection ring 122 proceeds to a fourth intermediate conductive segment 758 and similarly proceeds through a lower portion 733 by traversing between the fourth intermediate conductive segment 758 and a second conductive segment 760.

In another exemplary embodiment, the intermediate portion 732 is wider than the first horizontal portion 731 and the lower portion 733 is wider than the intermediate portion 732 such that a polygon that encloses the three portions 731, 732, 733 is a trapezoid 720. In one exemplary embodiment, the first horizontal portion 731 is more narrow such that a polygon that encloses the three portions 731, 732, and 733 is a triangle.

In one exemplary embodiment, the crack detection ring 122, after proceeding through portions 731, 732, and 733, similarly proceeds back up towards the first conductive segment 750 by proceeding through portions as shown in FIG. 7. In this example embodiment, portions increase in width as the crack detection ring progresses upward such that a trapezoid 730 that encloses the portions is vertically flipped as compared with the trapezoid 720.

Figure 8:
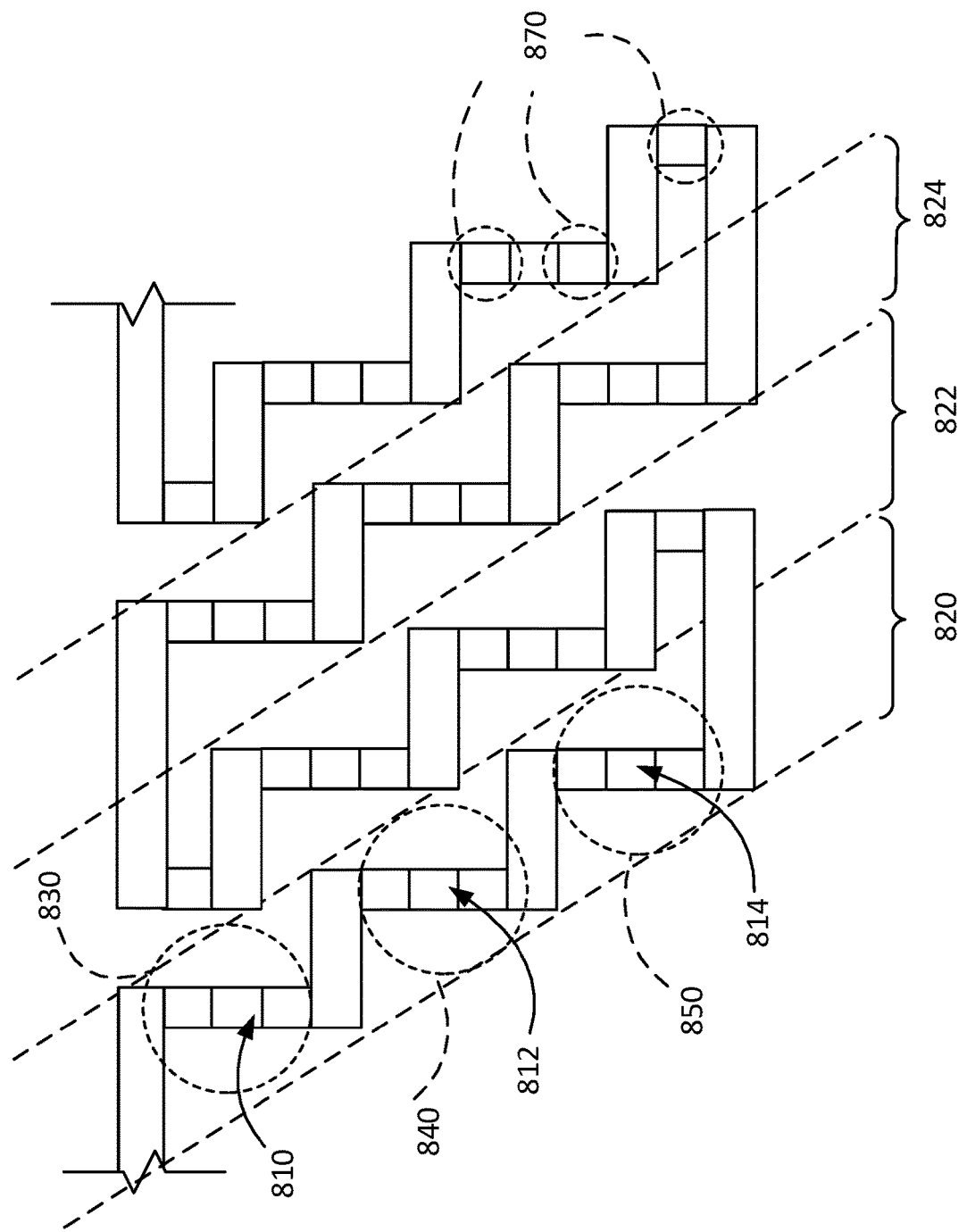
FIG. 8 is another illustration depicting another portion of a crack detection ring, according to another exemplary embodiment.

FIG. 8 is an illustration depicting one portion of a crack detection ring according to another exemplary embodiment. In this exemplary embodiment, a die includes an integrated circuit that includes a first conductive segment 810, an intermediate conductive segment 812, and a second conductive segment 814.

In another exemplary embodiment, the intermediate conductive segment 812 is linearly located between the first conductive segment 810 and the second conductive segment 814. In one exemplary embodiment, the crack detection ring 122 intersects the first conductive segment 810 at a first intersection 830, intersects the second conductive segment 814 at a second intersection 850, and intersects the intermediate conductive segment 812 at an intermediate intersection 840. As indicated in FIG. 8, the intermediate intersection 840 is between the first intersection 830 and the second intersection 850 and is horizontally offset in relation to the first intersection 830. In this exemplary embodiment, the second intersection 850 is also horizontally offset in relation to the first intersection 830 and the intermediate intersection 840. In one example embodiment, the second intersection 850 is horizontally offset to be linearly located with the first intersection 830 and the intermediate intersection 840.

In another exemplary embodiment, subsequent legs 822, 824 of the crack detection ring 122 are similarly offset and may be substantially parallel with the first leg 820 as depicted in FIG. 8.

FIG. 9 is an illustration depicting an electrical circuit for testing a crack detection ring, according to one exemplary embodiment. FIG. 9 is a circuit diagram depicting a circuit for a crack testing system 250.

In one exemplary embodiment, a voltage is applied to EN 920 which connects the crack detection ring 122 to a power source at between 1.6 and 2 volts. Electrical current from the power source travels through the crack detection ring 122 and proceeds to a voltage monitoring circuit that includes a comparator 930. The comparator 930 measures the voltage difference between the crack detection ring 122 (at the other end of the ring) and ensures that the voltage level of the ring structure exceeds a reference voltage VREF 940 (e.g., 1.2V). In response to the voltage level of the ring structure exceeding the reference voltage, the system determines that there are no cracks in the ring structure or determines other characteristics of the crack detection ring as described in relation to FIG. 3. In response to the voltage level of the ring structure not exceeding the reference voltage, the system determines that there is a crack in the edge of the die disrupting the ring structure.

Crack occurrence in the semiconductor die 120 may be determined by comparing the test input signal and the test output signal as set forth in the description of FIG. 3. The comparison of the test input signal and the test output signal may be performed variously. In some exemplary embodiments, voltage levels of the test input signal and the test output signal may be compared to measure a voltage drop through the crack detection ring and then determine the crack occurrence based on the voltage drop. For example, if the voltage drop exceeds a predetermined threshold, it may be determined that a crack has occurred. In other exemplary embodiments, phases of the test input signal and the test output signal may be compared to identify a phase difference or a delay time of the test input signal as it passes through the crack detection ring 122, and the crack occurrence may be determined based on the phase difference or delay time. The crack detector may apply the test input signal to the input end node of the three-dimensional crack detection structure, and receive the test output signal through the output end node of the three-dimensional crack detection structure, where the test output signal corresponds to the test input signal TSI after passing through the crack detection ring. The crack testing system 250 may determine the crack occurrence by comparing the test input signal and the test output signal. In some embodiments, the crack detector may detect if a crack has occurred by comparing the test input signal TSI and the test output signal.

Figure 10:
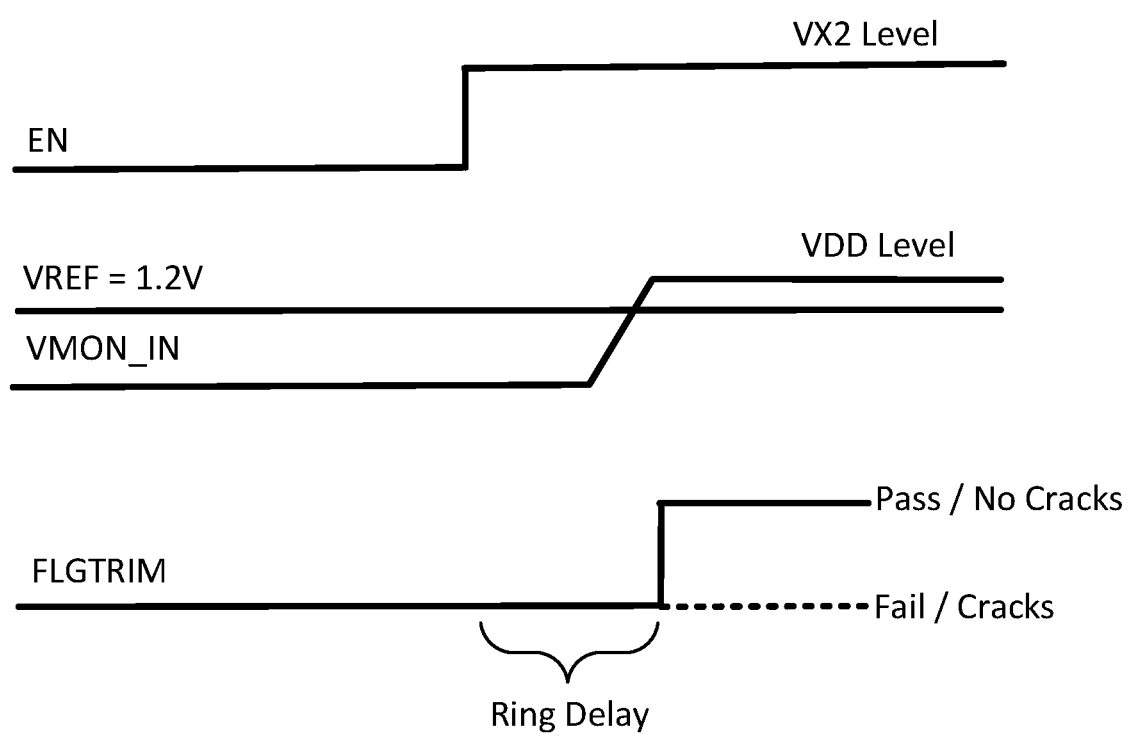
FIG. 10 is a chart illustrating signal levels of an electrical circuit, according to one exemplary embodiment.

FIG. 10 is a chart illustrating signal levels of an electrical circuit, according to one exemplary embodiment. In one exemplary embodiment, the voltage level of EN (e.g., one end of the crack detection ring 122) as indicated by the raised value of EN to level VX2.

In another exemplary embodiment, in an undamaged crack detection ring 122, the voltage level gradually raises above a reference voltage (e.g., VREF or 1.2 volts). VMON_IN is then input to a voltage comparator 930. In response to the output of the voltage comparator 930 not raising above the reference voltage, the crack testing system 250 determines that the crack detection ring is not continuous (e.g., it is broken). In response to the output of the voltage comparator 930 raising above the reference voltage, the crack testing system 250 determines that the crack detection ring 122 is undamaged.

Figure 11:
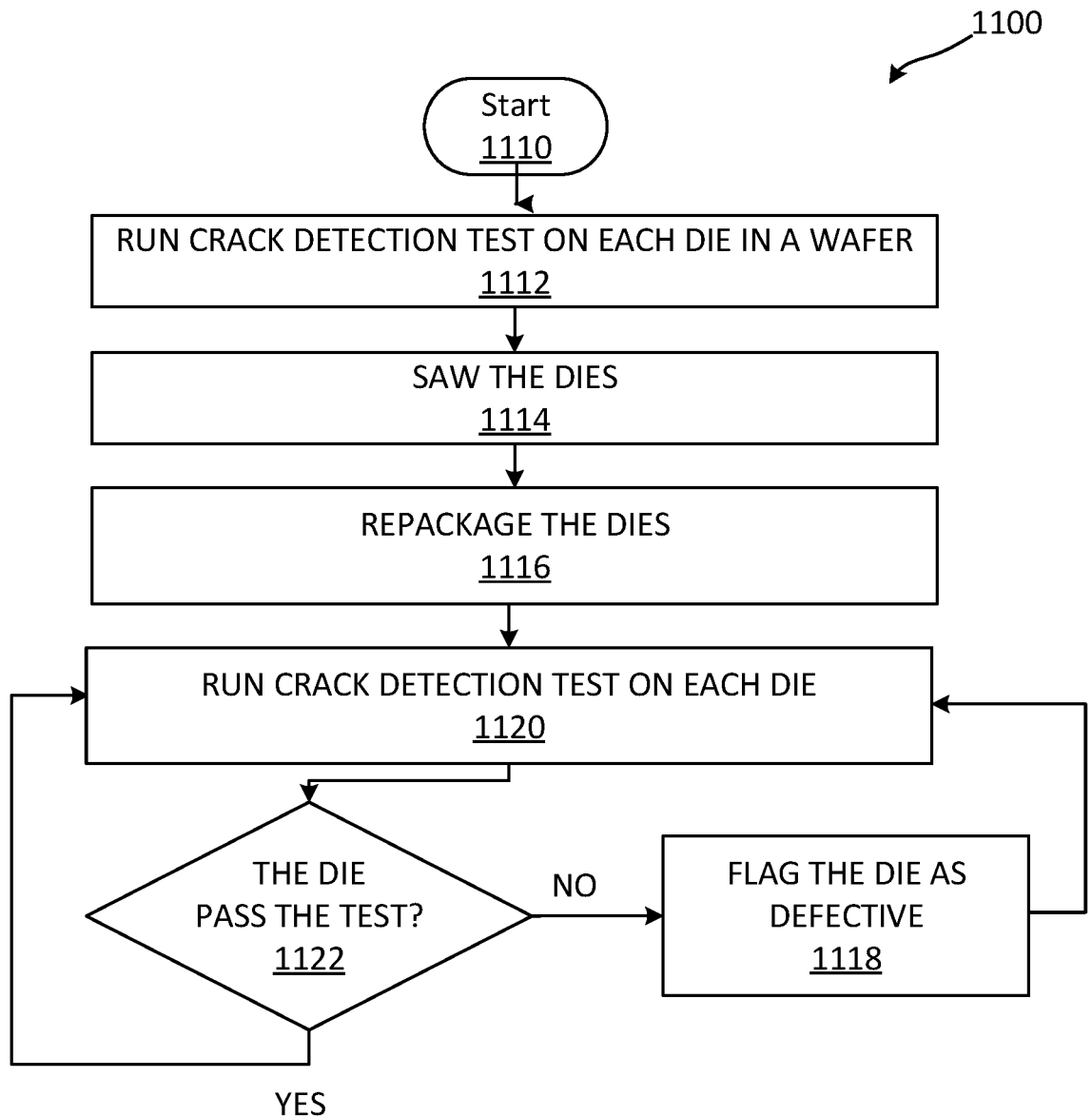
FIG. 11 is a flow chart diagram illustrating one method for testing a crack detection ring, according to one exemplary embodiment.

FIG. 11 is a flow chart diagram illustrating one method for testing a crack detection ring, according to one exemplary embodiment. The method 1100 may be performed after the formation of multiple dies on a wafer. In another exemplary embodiment, the method 1100 is performed by the crack testing system 250.

As shown, the method 1100 may start 1110 with a step 1112 in which the crack testing system 250 tests respective crack detection rings 122 for a plurality of dies on the wafer 110.

In a step 1114, the crack testing system 250 saws the levels on the wafer 110 to physically isolate each of the dies 120.

In a step 1116, the crack testing system 250 repackages each of the dies 120 that have been physically isolated.

In a step 1120, the crack testing system 250 individually tests each of the dies 120 by applying an electronic signal to each of the crack detection rings.

In a step 1122, the crack testing system 250 determines whether the respective dies pass the test according to one or more electrical signals received from the crack detection ring 122. As described in FIG. 3, based on current or voltage measurements, the crack testing system 250 determines whether the respective dies pass.

In response to the die 120 passing the test, the method 1100 continues at step 1118 and the crack testing system 250 flags the die as defective.

The present disclosure may be embodied in other specific forms without departing from its essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

The crack testing system may be included in an external tester or in an internal circuit of the semiconductor device. The crack detector may apply the first test input signal to the first input end node and then receive the first test output signal through the first output end node. Also, the crack detector may apply the second test input signal to the second input end node and then receive the second test output signal through the second output end node.

What is claimed is:

1. A die with an integrated circuit formed thereon, the die comprising:
   a first conductive segment that defines part of a crack detection ring;
   a second conductive segment that defines part of the crack detection ring; and
   an intermediate conductive segment, between the first conductive segment and the second conductive segment, that defines part of the crack detection ring;
   wherein the crack detection ring substantially surrounds the integrated circuit according to a serpentine path having a plurality of legs, each of which:
   intersects the first conductive segment at a first intersection;
   intersects the second conductive segment at a second intersection; and intersects the intermediate conductive segment at an intermediate intersection horizontally offset from at least one of the first intersection and the second intersection; and wherein the first leg and the second leg are positioned to resemble opposing sides of a first trapezoid, and a third leg and fourth leg of the plurality of legs, adjacent to the first leg and the second leg, are positioned to resemble opposing sides of a second trapezoid that is vertically flipped in relation to the first trapezoid.

2. The die of claim 1, wherein at least one of the plurality of legs comprises a horizontal portion extending along a portion of the intermediate conductive segment, wherein the first intersection is vertically aligned with a first end of the portion and the second intersection is vertically aligned with a second end of the portion.

3. The die of claim 1, wherein in each of the plurality of legs, the first conductive segment intersects, at the first intersection, with a first via extending at least partway from the first conductive segment to the intermediate conductive segment, and the second conductive segment intersects, at the second intersection, with a second via, horizontally offset from the first via, extending at least partway from the second conductive segment to the intermediate conductive segment.

4. The die of claim 1, wherein the crack detection ring comprises a first portion of the first conductive segment and a second portion of the first conductive segment, wherein the first portion and the second portion are offset from each other by a distance of 250 nm or less.

5. The die of claim 1, wherein a first leg of the plurality of legs comprises a horizontal portion that includes a first horizontal segment and a second horizontal segment, wherein the first horizontal segment and the second horizontal segment intersect different conductive segments.

6. The die of claim 1, wherein, for a first leg of the plurality of legs, the first intersection is horizontally offset in a first direction relative to the second intersection and, for a second leg of the plurality of legs that is adjacent to the first leg, the first intersection is horizontally offset in second direction, opposite to the first direction, from the second intersection.

7. The die of claim 6, wherein for the first leg and the second leg, the intermediate intersection is horizontally centered between the first intersection and the second intersection.

8. An apparatus comprising:
a memory device; and
a crack detection ring that substantially surrounds the memory device, the memory device formed at least partially on one or more of:

a first conductive segment;

an intermediate conductive segment; and a second conductive segment;

wherein the crack detection ring comprises a serpentine path having a first leg, a second leg, a third leg and a fourth leg, the first leg and the second leg are positioned to resemble opposing sides of a first trapezoid, and a third leg and fourth leg of the serpentine path, adjacent to the first leg and the second leg, are positioned to resemble opposing sides of a second trapezoid vertically flipped in relation to the first trapezoid; and wherein the first leg follows a pathway intersecting the first conductive segment, the intermediate conductive segment, and the second conductive segment.

9. The apparatus of claim 8, wherein the first leg comprises a horizontal segment extending along a portion of the intermediate conductive segment, the first leg intersecting the first conductive segment at a first end of the portion and intersecting the second conductive segment at a second end of the portion.

10. The apparatus of claim 8, wherein the crack detection ring comprises a first portion of the first conductive segment and a second portion of the first conductive segment, wherein the first portion and the second portion are offset from each other by a distance of 250 nm or less.

11. The apparatus of claim 8, further comprising a crack testing system that applies power to a first end of the crack detection ring, and measures one or more electrical properties of the crack detection ring at a second end of the crack detection ring.

12. The apparatus of claim 11, wherein the electrical properties of the crack detection ring comprise electrical current and crack testing system is further configured to determine whether a crack has damaged or broken the crack detection ring according to a threshold amount of current sensed at the second end of the crack detection ring.

13. The apparatus of claim 8 wherein a first intersection for the first leg is horizontally offset in a first direction relative to a second intersection for the first leg, and, a first intersection for the second leg is horizontally offset in second direction, opposite to the first direction, from a second intersection for the second leg.

14. The apparatus of claim 13, wherein for the first leg and the second leg, an intermediate intersection is horizontally centered between the first intersection and the second intersection.

* * * * *